(12) United States Patent
Madmoni

(10) Patent No.: US 11,083,984 B2
(45) Date of Patent: Aug. 10, 2021

(54) DUCT FOR USE IN A SYSTEM FOR SEPARATING PARTICLES SUSPENDED IN A FLUID, AND A METHOD OF DESIGNING SUCH DUCT

(71) Applicant: AQUA HD SEPARATION & FILTRATION SYSTEMS LTD, Hofit (IL)

(72) Inventor: Shahar Madmoni, Givatayim (IL)

(73) Assignee: AQUA HD SEPARATION & FILTRATION SYSTEMS LTD

( * ) Notice: Subject to any disclaimer, the term of this patent is extended or adjusted under 35 U.S.C. 154(b) by 147 days.

(21) Appl. No.: 15/756,412

(22) PCT Filed: Sep. 1, 2016

(86) PCT No.: PCT/IL2016/050962
§ 371 (c)(1),
(2) Date: Feb. 28, 2018

(87) PCT Pub. No.: WO2017/037714
PCT Pub. Date: Mar. 9, 2017

(65) Prior Publication Data
US 2018/0280837 A1  Oct. 4, 2018

Related U.S. Application Data

(60) Provisional application No. 62/213,640, filed on Sep. 3, 2015.

(51) Int. Cl.
*B01D 21/24* (2006.01)
*B01D 21/26* (2006.01)
(Continued)

(52) U.S. Cl.
CPC ..... *B01D 21/0054* (2013.01); *B01D 21/0003* (2013.01); *B01D 21/245* (2013.01); *B01D 21/265* (2013.01); *G06F 30/20* (2020.01)

(58) Field of Classification Search
CPC ....... B03B 5/62; B04B 2005/045; B04C 1/00; B01D 21/0054; B01D 21/265
See application file for complete search history.

(56) References Cited

U.S. PATENT DOCUMENTS

| | | |
|---|---|---|
| 1,836,758 A | 12/1931 | Knapp |
| 4,001,121 A | 1/1977 | Bielefeldt |

(Continued)

FOREIGN PATENT DOCUMENTS

| | | |
|---|---|---|
| DE | 2929139 A1 | 1/1981 |
| EP | 1942329 A2 | 7/2008 |

(Continued)

OTHER PUBLICATIONS

Wakeman, "Liquid-Solid Separation", http://thermopedia.com/content/928/, last accessed Nov. 30, 2018.

*Primary Examiner* — David C Mellon
(74) *Attorney, Agent, or Firm* — Dorsey & Whitney LLP

(57) ABSTRACT

A duct for use in a system for separating particles suspended in a fluid and a method for designing such duct. The duct comprises at least one trapping-bay portion having a main channel extending along a curved central line defining a fluid flow direction and trapping bay(s) for trapping at least a part of the particles and coextensive with the channel along the line. The channel and the bay(s) are as follows in a cross-section of the trapping-bay portion taken perpendicularly to the line: the channel has a basic polygonal shape defined by at least four channel walls including outer, inner, upper and lower channel walls; and the bay protrudes from the inner and/or outer channel walls away from the line and has bay walls generally parallel to the corresponding walls of the channel oriented in the same way, the area of the bay smaller than that of the channel.

14 Claims, 9 Drawing Sheets

(51) Int. Cl.
 *G06F 30/20* (2020.01)
 *B01D 21/00* (2006.01)

(56) References Cited

U.S. PATENT DOCUMENTS

| | | | |
|---|---|---|---|
| 4,343,707 A | 8/1982 | Lucas | |
| 4,383,917 A | 5/1983 | Wells | |
| 4,390,351 A | 6/1983 | Matsui et al. | |
| 4,848,991 A | 7/1989 | Bielefeldt | |
| 4,895,652 A | 1/1990 | Cornelissen | |
| 5,248,421 A * | 9/1993 | Robertson | B01D 17/0217 |
| | | | 209/723 |
| 8,276,760 B2 | 10/2012 | Lean et al. | |
| 8,647,479 B2 | 2/2014 | Lean et al. | |
| 8,869,987 B2 | 10/2014 | Lean et al. | |
| 8,875,903 B2 | 11/2014 | Lean et al. | |
| 8,931,644 B2 | 1/2015 | Lean et al. | |
| 2008/0128331 A1 | 6/2008 | Lean et al. | |
| 2008/0129331 A1 | 6/2008 | Binder | |
| 2008/0290048 A1 | 11/2008 | Jaeggi et al. | |
| 2009/0014360 A1 * | 1/2009 | Toner | B01D 45/12 |
| | | | 209/208 |
| 2009/0114607 A1 | 5/2009 | Lean et al. | |
| 2009/0283455 A1 | 11/2009 | Lean et al. | |
| 2010/0031432 A1 | 2/2010 | Lappalainen | |
| 2011/0108491 A1 | 5/2011 | Lean et al. | |
| 2012/0318719 A1 | 12/2012 | Lean et al. | |
| 2014/0367348 A1 | 12/2014 | Volkel et al. | |
| 2014/0367349 A1 | 12/2014 | Volkel et al. | |
| 2015/0165347 A1 | 6/2015 | Nichols et al. | |
| 2015/0166956 A1 | 6/2015 | Puleo et al. | |
| 2015/0238963 A1 | 8/2015 | Han et al. | |

FOREIGN PATENT DOCUMENTS

| | | |
|---|---|---|
| EP | 2058284 A1 | 5/2009 |
| EP | 2378266 A1 | 10/2011 |
| EP | 2946821 A1 | 11/2015 |
| FR | 2918900 A1 | 1/2009 |
| GB | 499024 A | 1/1939 |
| GB | 2130913 A | 6/1984 |
| SU | 639578 A1 | 12/1978 |
| TW | 201509508 A | 3/2015 |
| WO | 9609103 A1 | 3/1996 |
| WO | 2008130977 A2 | 10/2008 |
| WO | 2009024678 A2 | 2/2009 |
| WO | 2010115025 A2 | 10/2010 |

* cited by examiner

DUCT FOR USE IN A SYSTEM FOR SEPARATING PARTICLES SUSPENDED IN A FLUID, AND A METHOD OF DESIGNING SUCH DUCT

TECHNOLOGICAL FIELD

The presently disclosed subject matter refers to the field of separating particles suspended in a fluid, more particularly, to static separation of such particles in a substantially laminate fluid flow within a curved duct.

BACKGROUND

Systems of the kind, to which the presently disclosed subject matter refers, for removing particles or floc elements from a suspension flowing along a curved duct and outputting the fluid and the separated particles through different channels, are disclosed, for example, in U.S. Pat. No. 8,276,760, U.S. Pat. No. 8,869,987 and U.S. Pat. No. 8,875,903.

GENERAL DESCRIPTION

In accordance with one aspect of the presently disclosed subject matter there is provided a duct for use in a system for separating particles suspended in a fluid, the duct comprising at least one trapping-bay portion having a main channel extending along a curved central line defining a fluid flow direction and one or more trapping bays configured for trapping at least a part of said particles and coextensive with the main channel along the central line, the main channel and at least one of the bays are as follows in a cross-section of the trapping-bay portion taken perpendicularly to said central line:
  the main channel has a basic polygonal shape defined by at least four channel walls including an outer channel wall, an inner channel wall, an upper channel wall and a lower channel wall; and
  the trapping bay protrudes from at least one of the inner and outer channel walls away from the central line and has bay walls generally parallel to the corresponding walls of the main channel oriented in the same way, the area of said bay being smaller than that of the main channel.

The main channel and/or the trapping bay can have in the above cross-section a dimension between its inner and outer walls essentially greater than that between its lower and upper walls. The trapping bay can further have a stepped configuration with a number of mutually perpendicular walls.

The duct can be arcuate or spiral at least along some of its portions. In this case the trapping-bay portion can constitute at least a portion of a turning of a spiral or of a circle.

The duct can further comprise at least one basic channel portion upstream the trapping-bay portion, the basic channel portion having, at least at the area of its merger with the trapping-bay portion, shape and dimensions identical to those of the main channel of the trapping-bay portion.

The duct can further comprise at least one partitioned portion, comprising a main channel and a trapping bay similar to those of the trapping-bay portion upstream of the partitioned portion, and further comprising at least one partition wall extending along a length of the partitioned portion and disposed between outer or inner wall of the main channel and the central line. The wall can be configured to enable continuation of fluid flow along the main channel while preventing movement of particles from the trapping-bay portion back to the main channel and to be extracted while flowing within the partitioned portion. The partition wall can be disposed closer to the trapping bay than to the central line, and configured to enable continuation of fluid flow along the main channel and along the trapping bay while preventing movement of particles trapped within the bay back to the main channel.

The duct can comprise an inlet for receiving therein fluid from an external source and each of said main channel and the bay of the trapping-bay portion or of the partitioned portion can include its own outlet for discharging fluid therefrom.

In accordance with another aspect of the presently disclosed subject matter, there is provided a duct for use in a system for separating particles suspended in a fluid, the duct extends along a curved central line defining a fluid flow direction and comprising at least one segment having a polygonal shape defined by at least four duct walls including an outer duct wall, an inner duct wall, an upper duct wall and a lower duct wall, in first a cross-sectional plane of the segment passing through the central line, at least one of the inner and outer duct walls of said segment having a profile, in a second cross-sectional plane perpendicular to the first cross-sectional plane and comprising the central line, which is defined by a varying distance between the corresponding wall and the central line.

The profile of at least one of the inner and outer walls can have an undulating, e.g. sinusoidal, shape.

In addition, the duct according to this aspect can have features of described above with respect to the duct according to the first aspect of the presently disclosed subject matter.

In accordance with a further aspect of the presently disclosed subject matter there is provided a method of designing a duct for use for a system for separating particles suspended in a fluid, using a computer provided with an flow analysis and particles tracing separation software, the method comprising:
  (a) inputting in the computer initial process parameters including at least parameters of the fluid and the particles to be received in the duct, and desired extent of separation between the fluid and the particles to be discharged from the duct;
  (b) inputting in the computer initial parameters of the duct, the duct extending along a curved central line defining a fluid flow direction and having a polygonal shape defined by at least four duct walls including an outer duct wall, an inner duct wall, an upper duct wall and a lower duct wall, in a cross-sectional plane of the duct perpendicular to the central line;
  (c) performing by the computer a flow analysis based on the initial process parameters, including at least the flow velocity and pressure profiles of the flow along the duct;
  (d) performing by the computer particle tracing analysis of the flow of the fluid having parameters obtained in step (c);
  (e) adjusting the duct parameters including at least a local change of the geometry of the duct in correspondence with the particle tracing analysis in step (d);
  (f) performing step (c') and (d') similar to steps (c) and (d) for the duct having the duct parameters adjusted in step (e), until final adjusted parameters of the duct are obtained with which the desired extent of separation is achieved; and (g) outputting the final adjusted parameters of the duct in a manner suitable for their use in producing the duct.

The method can be used for designing a duct which has any features of the ducts described above and/or described in the detailed description of embodiments.

For example, the method the local change in the geometry referred to in step (e) above can comprise changing at least one portion of the duct to become a trapping-bay portion having a main channel and one or more trapping bays configured for trapping at least a part of said particles and coextensive with the main channel along the central line, the main channel and at least one of the bays are as follows in a cross-section of the trapping-bay portion taken perpendicularly to said central line:

the main channel has a basic polygonal shape defined by at least four channel walls including an outer channel wall, an inner channel wall, an upper channel wall and a lower channel wall; and the trapping bay protrudes from at least one of the inner and outer channel walls away from the central line and has bay walls generally parallel to the corresponding walls of the main channel oriented in the same way, the area of said bay being smaller than that of the main channel.

In addition or alternatively, the local change in the geometry referred to in step (e) above can comprise changing at least one of the inner and outer duct walls of a segment of the duct to have a profile, in a cross-sectional plane comprising the central line and crossing the inner and outer walls, which is defined by a varying distance between the corresponding wall and the central line.

The above method can constitute a part of a process of producing the duct with the final duct parameters.

According to a further aspect of the present invention, there is provided a duct having a configuration obtainable by designing the duct using the above method.

A duct according to any of the above aspects can be used in any system for separating particles suspended in a fluid, and particularly, in static systems, which are free of moving components or other components actively operated to provide the separation, which can result in reducing the cost and failure rates that are typical in non-static systems.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which.

DETAILED DESCRIPTION OF EMBODIMENTS

A duct according to the presently disclosed subject matter, for use in a static system for separating particles suspended in a fluid, can have several types of duct portions, at least some of which can be curved. Each type of a duct portion can extend along a part of the duct's length, as desired, for controlling flow parameters in order to facilitate the accumulation of particles required to be extracted from the fluid.

Due to mechanical forces acting on particles within the fluid flow due to the curved shape of the duct and its spatial configuration, the particles having similar parameters tend to follow similar trajectories within the flow, which can lie close to or far from a given duct's wall. Assuming the duct is arcuate or spiral along at least a part of its length, and has corresponding outer and inner walls, heavier or larger particles will normally tend to flow along the outer wall of the duct and lighter or smaller particles tend to flow near the inner wall of the duct.

The duct can have a central line corresponding to the flow direction, a basic polygonal shape in its cross-section taken perpendicular to this central line, can include straight or curved portions extending along different segments of the central line, and can be configured to provide, at least along some of these portions, a desired laminar flow of a fluid. The polygonal shape of the duct in the above cross-section can be such that the duct's dimension between the inner and outer wall is essentially greater than that between the upper and lower walls. In particular, the ratio between the former and the latter dimensions can be at least 5:1, more particularly, at least 10:1, and still more particularly, at least 15:1.

Figure 1:
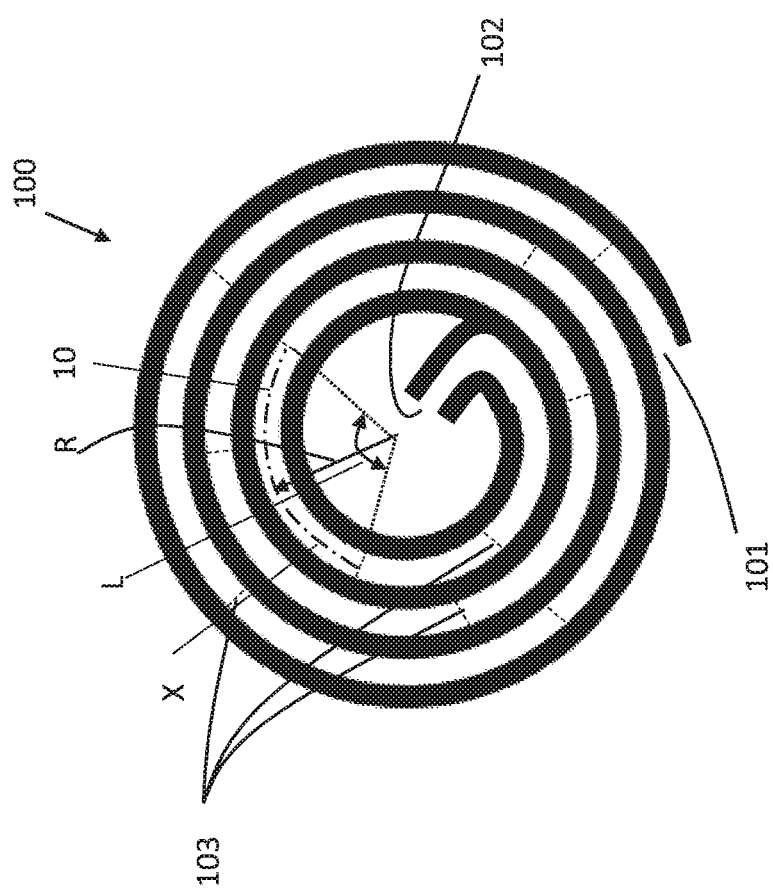
FIG. 1 illustrates one example of a spiral duct, which can be designed at least partially according to any embodiments of the presently disclosed subject matter.

The duct portions can differ by their shape in a cross-section taken perpendicular to the central line and/or in a cross-section taken along the central line perpendicularly to the inner and outer duct walls. In addition or alternatively, they can also differ by the shape of the central line, e.g. its radius of curvature, and/or by their extension along the central line. Thus, in a duct or a part thereof having a radius of curvature, different portions can have a different angular span. In general, the angular span of the duct portions can be not less than 25 degrees. In a duct having one or more turnings of a substantially flat spiral, e.g. as shown in FIG. 1, portions of the duct relating to different turnings will have different radii of curvature. Each type of a duct portion can appear more than once along the length of the duct with the same or different various cross-sectional shapes and dimensions. In accordance with one aspect of the presently disclosed subject matter, these differences can be used, when designing the duct, to cause the particles to follow desired trajectories within the duct.

In the example of FIG. 1, the duct 100 has an inlet 101 and an outlet 102, and a spiral central line X extending therebetween, and it can be segmented along this central line into portions of various types, such as basic channel portions, trapping-bay portions, and partitioned portions described below in more details, or portions of the same type having different geometry/dimensions. Each portion extends between transitional locations 103 and is defined by its angular span L and radius of curvature R, which can be selected to achieve within the portion a desired hydrodynamic performance of the fluid flow, and particularly, particles to be separated, according to a pre-determined plan, which can be generated, for example, as described below.

Figure 2A:
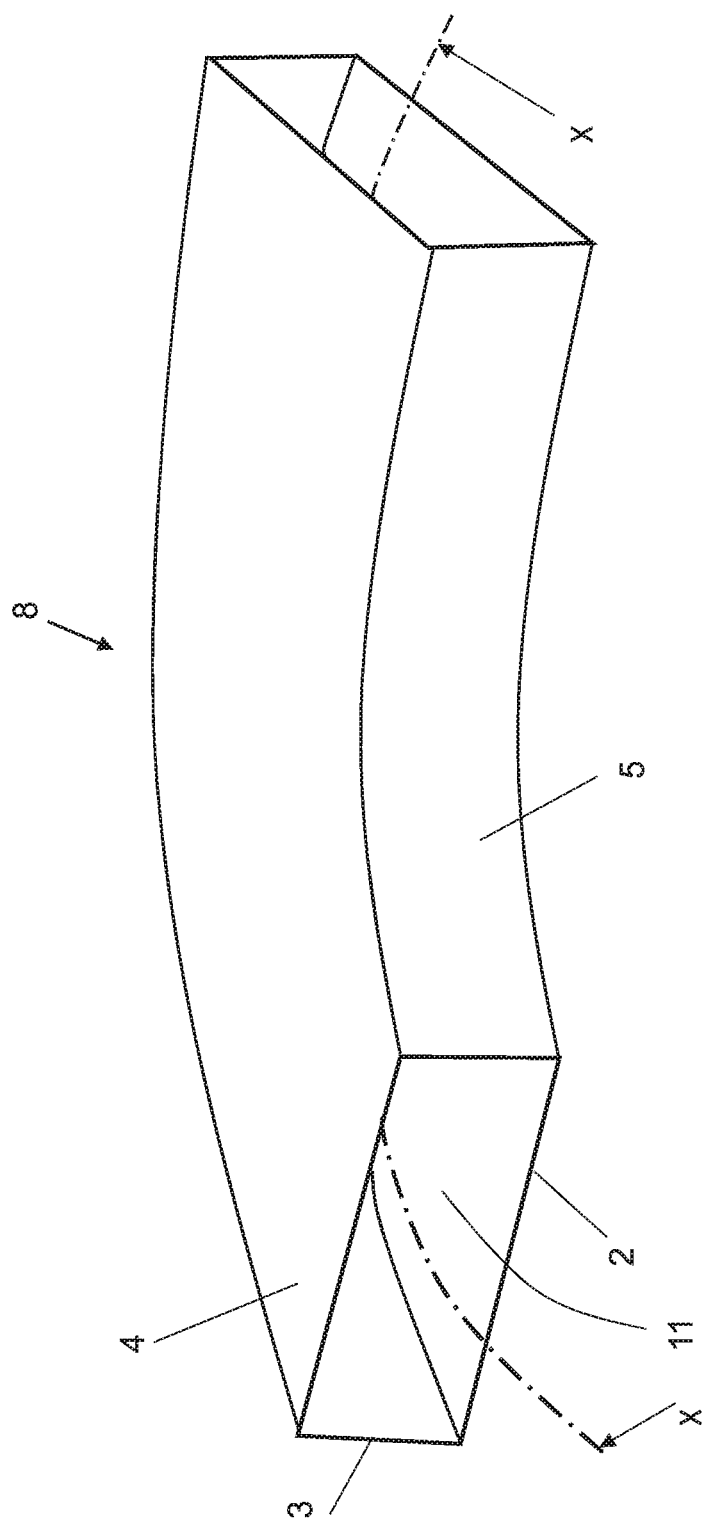
FIG. 2A and FIG. 2B are schematic isometric views of one example of a basic channel portion and a trapping-bay portion, respectively, each of which can constitute a part of a duct according to the presently disclosed subject matter.

One example of a basic channel portion 8 is shown in FIG. 2A, and it has a basic rectangular cross-sectional shape in a plane perpendicular to the central line, defined by four channel walls: outer and inner channel walls 3 and 5, and lower and upper channel walls 2 and 4, respectively. One basic channel portion can extend, for example, from the duct inlet 101 along a part of the first turning thereof.

In operation, during the flow of fluid with suspended particles along the curved basic channel portion there are inertial and centripetal forces acting on the particles. Due to the inertia momentum, the particles will tend to maintain their direction of movement, and due to the centripetal forces will tend to migrate inwards to the center of the curvature. In general, heavy and large particles will tend to move to the vicinity of the outer channel wall of the duct and light and small particles will be pushed away by the fluid towards the inner channel wall.

Accordingly, providing a trapping-bay portion downstream the basic channel portion, and adjacent the outer and/or inner channel walls, can facilitate the accumulation of particles distributed as mentioned above in said trapping-bay portion whilst reducing the amount of fluid accompanying these particles. The trapping-bay portion can thus comprise a main channel, optionally constituting a continuation of the basic channel portion described above, at least along a majority of the cross-sectional area of the basic channel portion, and at least one bay merging and coextensive with the main channel, configured to accommodate therein particles of at least one type.

Figure 2B:
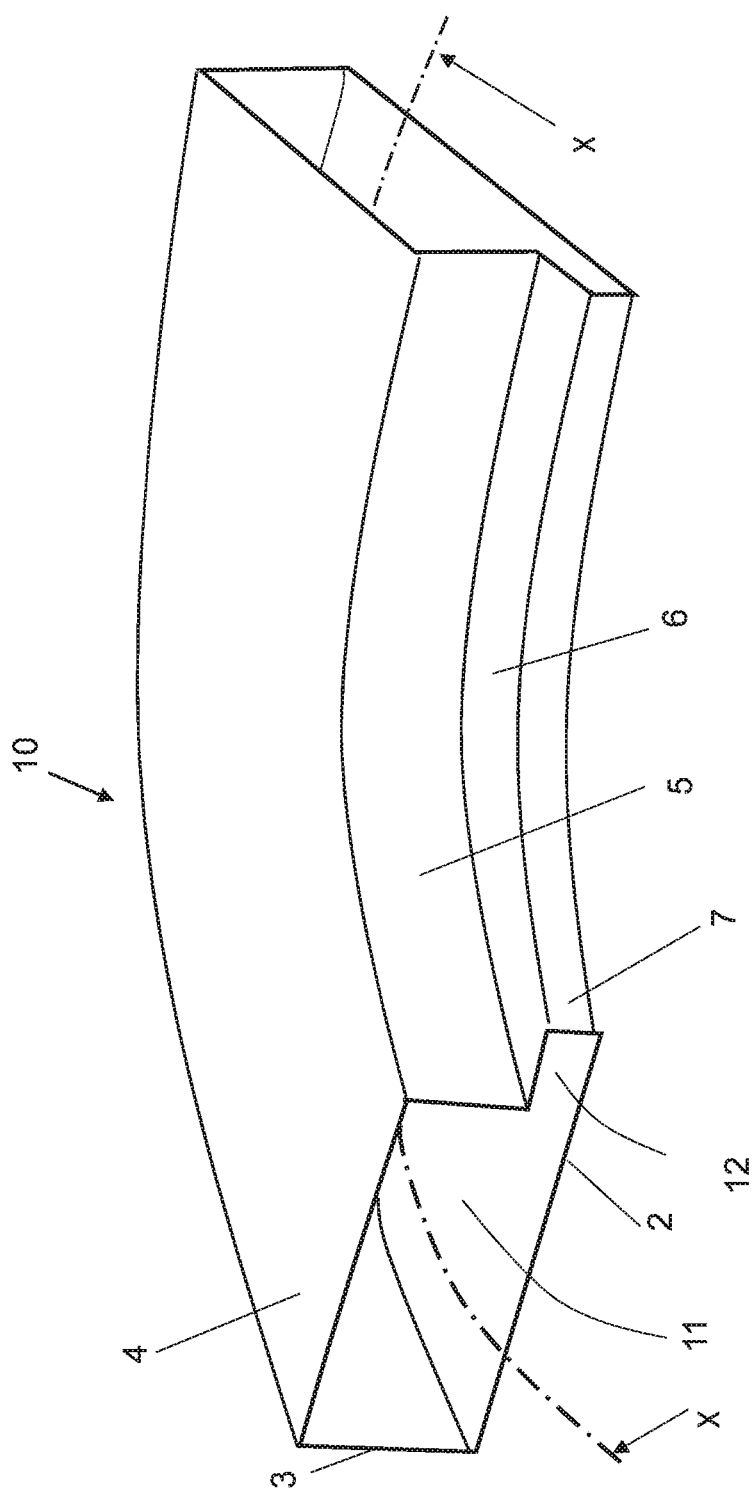

One example of such trapping-bay portion is a trapping-bay portion 10 shown in FIG. 2B. The trapping-bay portion comprises a main channel 11 and a trapping bay 12 coextensive with the main channel 11 along the central line X. The main channel 11 in this embodiment, has a rectangular shape defined by four channel walls: outer and inner channel walls 3 and 5, and lower and upper channel walls 2 and 4, respectively. The trapping bay 12 protrudes from the inner channel wall 5 away from the central line X and has bay walls 6,7,2 generally parallel to the corresponding walls of the main channel oriented in the same way. Namely, the bay walls 6,7,2 are parallel or coincide to the respective channel walls 4, 5, 2. The area of the bay 12 is smaller than that of the main channel 11 and some of its walls have lengths that are shorter than those of the corresponding walls of the main channel. The dimension of the bay between its inner and outer walls can be essentially greater than that between its upper and lower walls. In particular, the ratio between the former and the latter dimensions can be at least 5:1, more particularly, at least 10:1, and still more particularly, at least 15:1.

Figure 3:
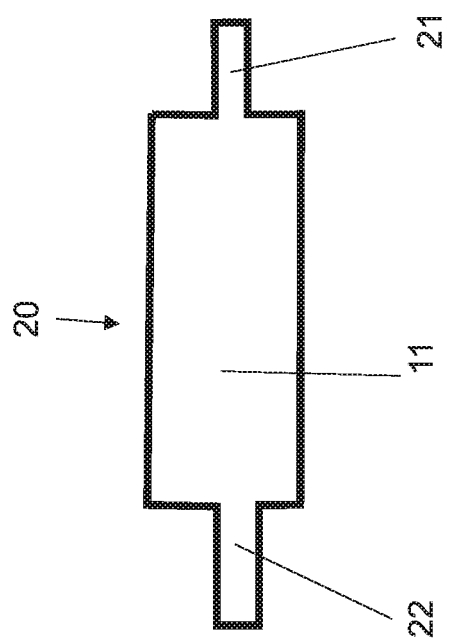
FIG. 3 is a schematic cross-sectional view of another example of a trapping-bay portion, which can constitute a part of a duct according to the presently disclosed subject matter.

There can be more than one bay in a single trapping-bay portion. Thus, FIG. 3 illustrates a cross-section of an example of a trapping-bay portion 20, which differs from the trapping-bay portion 10 by having two trapping bays, an inner trapping bay 21 and an outer trapping bay 22, each protruding from the corresponding wall. The areas of each of the bays 21 and 22 are smaller than that of the main channel 11 and some of their walls have lengths that are shorter than those of the corresponding walls of the main channel.

Bays like the bay 12 shown in FIG. 2B and 21 as shown in FIG. 3, which are associated with the inner wall of the channel 11, will capture the particles that will move and congregate due to the centripetal force that applies on particles that are light and small. Bay 22 in FIG. 3 will capture the particles that will move and congregate due to the inertia force that applies on particles that are heavy and large.

Each of the trapping bays 12, 21 and 22 can have a configuration different from those shown in FIG. 2B or FIG. 3. For example, they can be located at different heights along the inner or outer walls of the main channel, their width or length can vary, and the number of walls can change, for example, in case the bay has a stepped shape.

Trapped particles can be extracted out of the system directly from trapping bays or after being directed into partitioned portions.

There can be one or more partitioned portions constructed throughout the duct, each at a different location and may vary in their partition positioning within the main channel. The partitioned portions may be constructed downstream trapping-bay portions or downstream basic channel portions, each to target a zone that is expected to have accumulation of certain particles.

Particles captured within the partitioned channel can then be extracted, for example through some exit ports placed along the channel. The rest of the fluid continues to flow within the main channel. As the fluid passes beyond an extraction point, a change can be implemented to the cross-section and the central line curvature of the duct by additional duct portions in order to change the fluid flow dynamics. This will cause additional particles to accumulate within a specific zone of the duct, following by adding new partitioned portions in order to capture these particles. This process of accumulating and extracting particles can be repeated a desired number of times along the duct. The same type of particles can be extracted in multiple places in order to capture those escaped from upstream extractions.

Figure 4A:
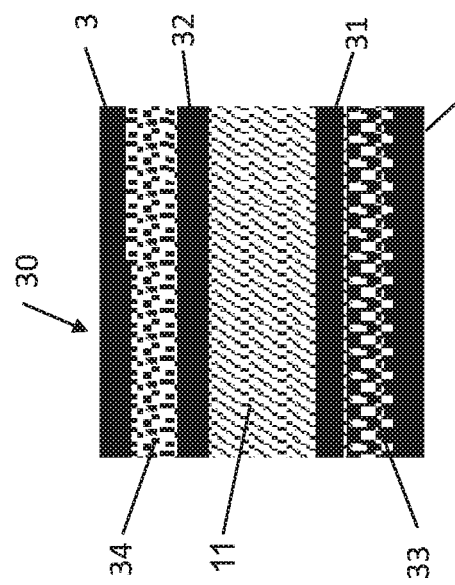
FIG. 4A is a schematic cross-sectional view of one example of a partitioned trapping-bay portion, which can constitute a part of a duct according to the presently disclosed subject matter.
Figure 4B:
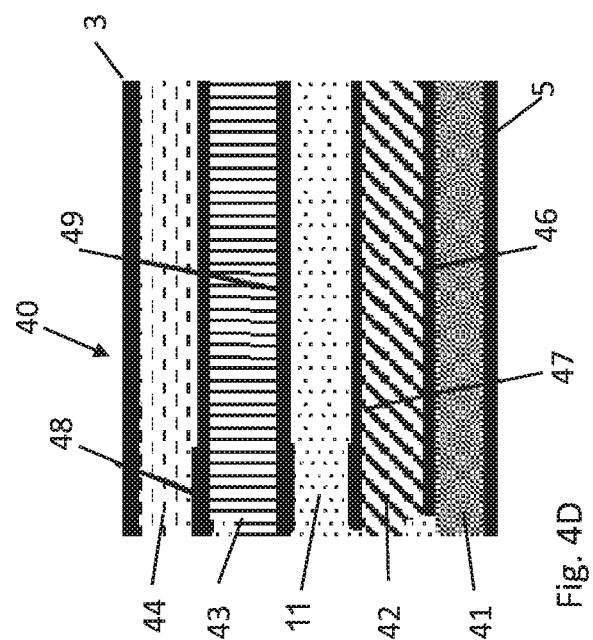
FIG. 4B is a schematic illustration of a possible distribution of particles in fluid flowing within the partitioned trapping-bay portion shown in FIG. 4A.

Examples of partitioned portions are illustrated in FIGS. 4A and 4B, where a partitioned portion 30 is shown as comprising, addition to the main channel 11 and the trapping bays 21 and 22, two partition zones 33 and 34, constructed by two walls 31 and 32, which extend between the upper and lower walls of the main channel and continue along a length of the partitioned portion, to enable the continuation of the fluid flow along the main channel and along the trapping bay while preventing the return of particles trapped within the bay back to the main channel. The location of each partition wall is configured to allow trapping of particles accumulated in the trapping bays while keeping other fluid out of the partitioned area. For example, in FIGS. 4A and 4B, both partition walls 31 and 32 are located near the bay to allow keeping more of the clean fluid within the main channel.

Figure 4C:
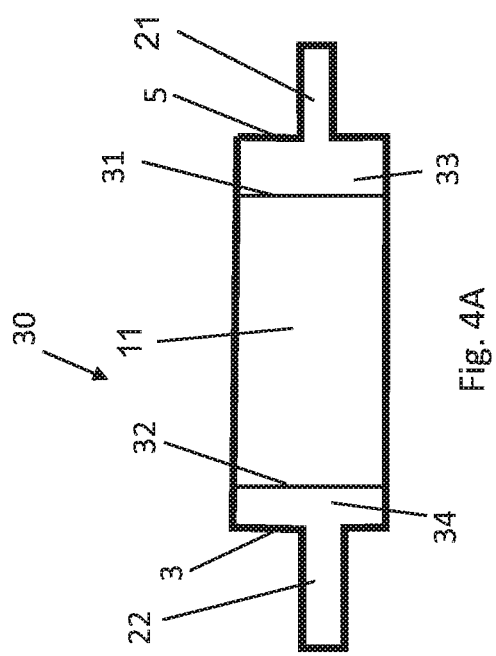
FIG. 4C is a schematic cross-sectional view of another example of a partitioned portion, which can constitute a part of a duct according to the presently disclosed subject matter.
Figure 4D:
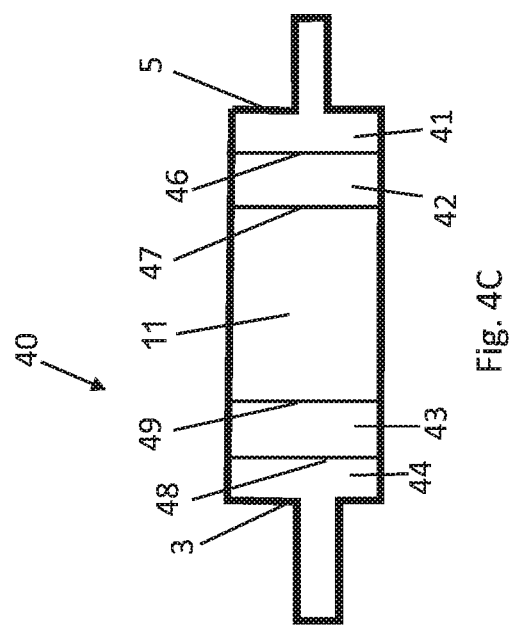
FIG. 4D is a schematic illustration of a possible distribution of particles in fluid flowing within the partitioned trapping-bay portion shown in FIG. 4C.

In another example, illustrated in FIGS. 4C and 4D, a partition portion 40 has multiple partition zones 41 to 44 separated by walls 46 to 49 that extend between the upper and lower walls of the main channel and along a length of the partitioned portion 40. Such configuration allows the separation of the fluid into multiple types of particles that will have different accumulation zones along the main channel.

In addition to the structures of duct portions described above, or alternatively, the duct according to the presently disclosed subject matter can have, in at least one segment thereof, inner and outer walls, at least one of which has, in a cross-sectional plane of the segment passing through the central line and crossing the walls, a profile defined by a varying distance between the corresponding wall and the central line. These variations can help controlling the velocity of the fluid, maintaining a laminar characteristic within the channel and, particularly, in accumulating particles suspended in it.

Figure 5:
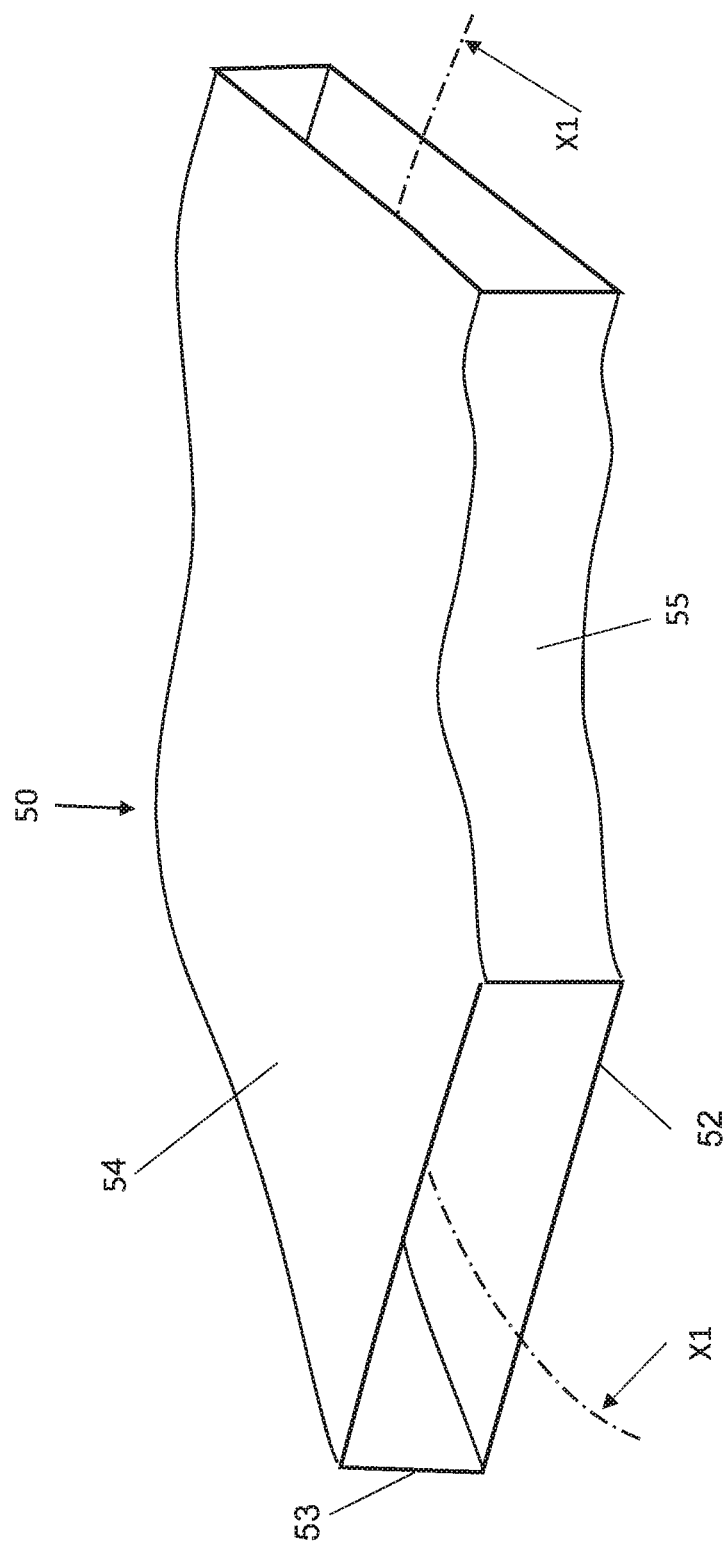
FIG. 5 is a schematic isometric view of a portion of a duct according to a further embodiment of the presently disclosed subject matter.

Example of one such segment is shown in FIG. 5, where a segment 50 has inner and outer duct walls 55 and 53, which in its cross-sectional plane passing through the central line X and crossing the walls 55 and 53, have a profile defined by a varying distance between the corresponding wall and the central line. More particularly, each of the inner and outer walls 55 and 53 has an undulating shape.

Figure 6:
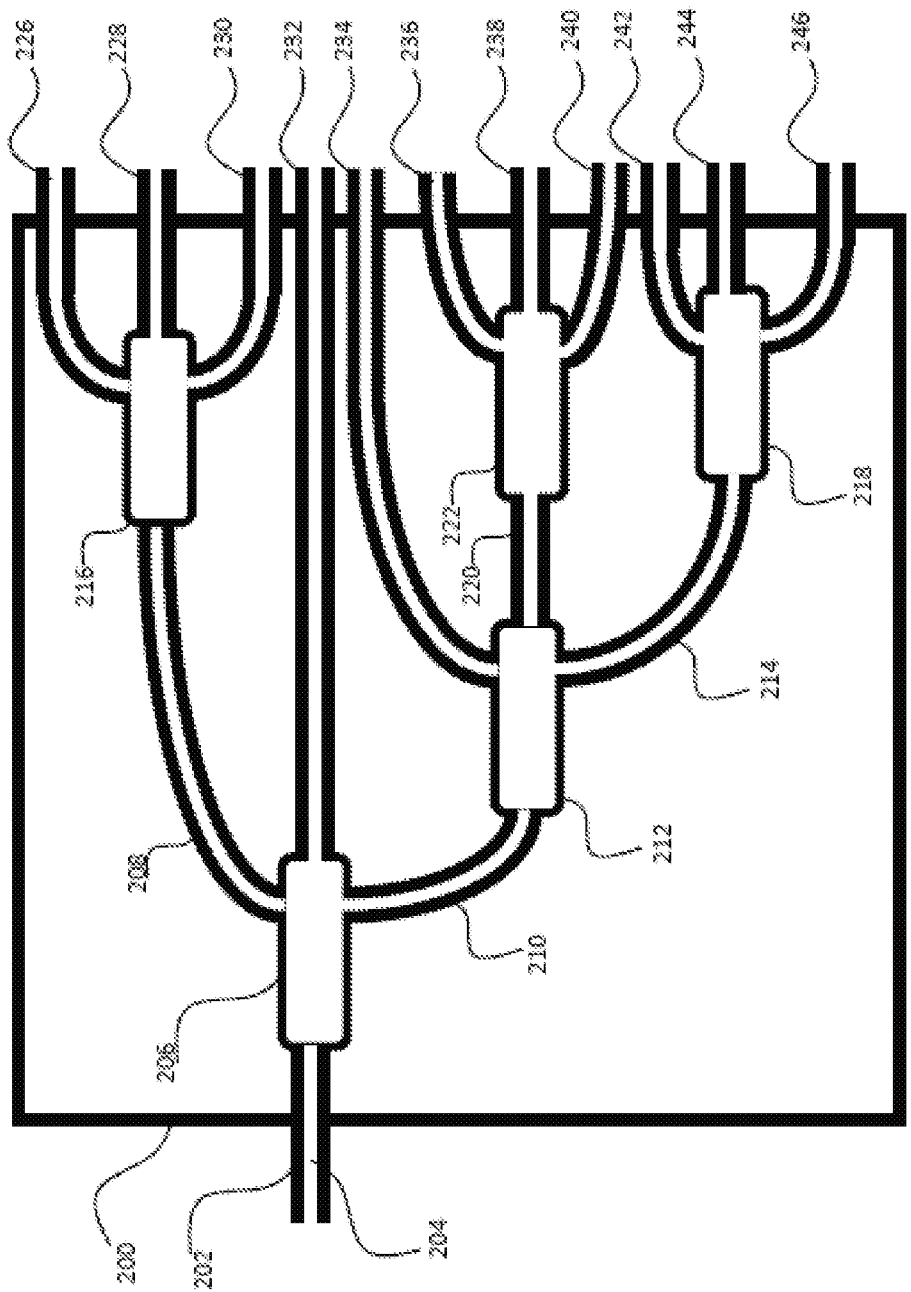
FIG. 6 illustrates an example of a system constructed of a plurality of interconnected particles separation systems.

A plurality of particles separation systems having ducts formed with portions as described about can be used in combination, e.g. as illustrated in FIG. 6. At least a part of the ducts can each enable the separation of an incoming fluid into three channels, one—the main channel and two the trapping-bay and partitioned portions. The latter portions are configured to output particles trapped thereby whilst the main channel is configured to feed the residual fluid into the next separation system, until desired separation is complete.

In operation, fluid 204 flows through channel 202 into the first separation system 206, such as described above, where some of the particles are trapped and extracted into output channel 210 and others into channel 208, while the residue fluid 232 flows out as an output. The fluid from the output channel 210 thus flows into a second separation system 212 and processed using trapping-bay and partitioned portions into output 234, while output channel 214 leads fluid into separation system 218 where it is processed using trapping-bay and partitioned portions into outputs 242, 244, 246. The fluid within output channel 208 goes into separation system 216 and processed using trapping-bay and partitioned portions into outputs 226, 228, 230.

Figure 7:
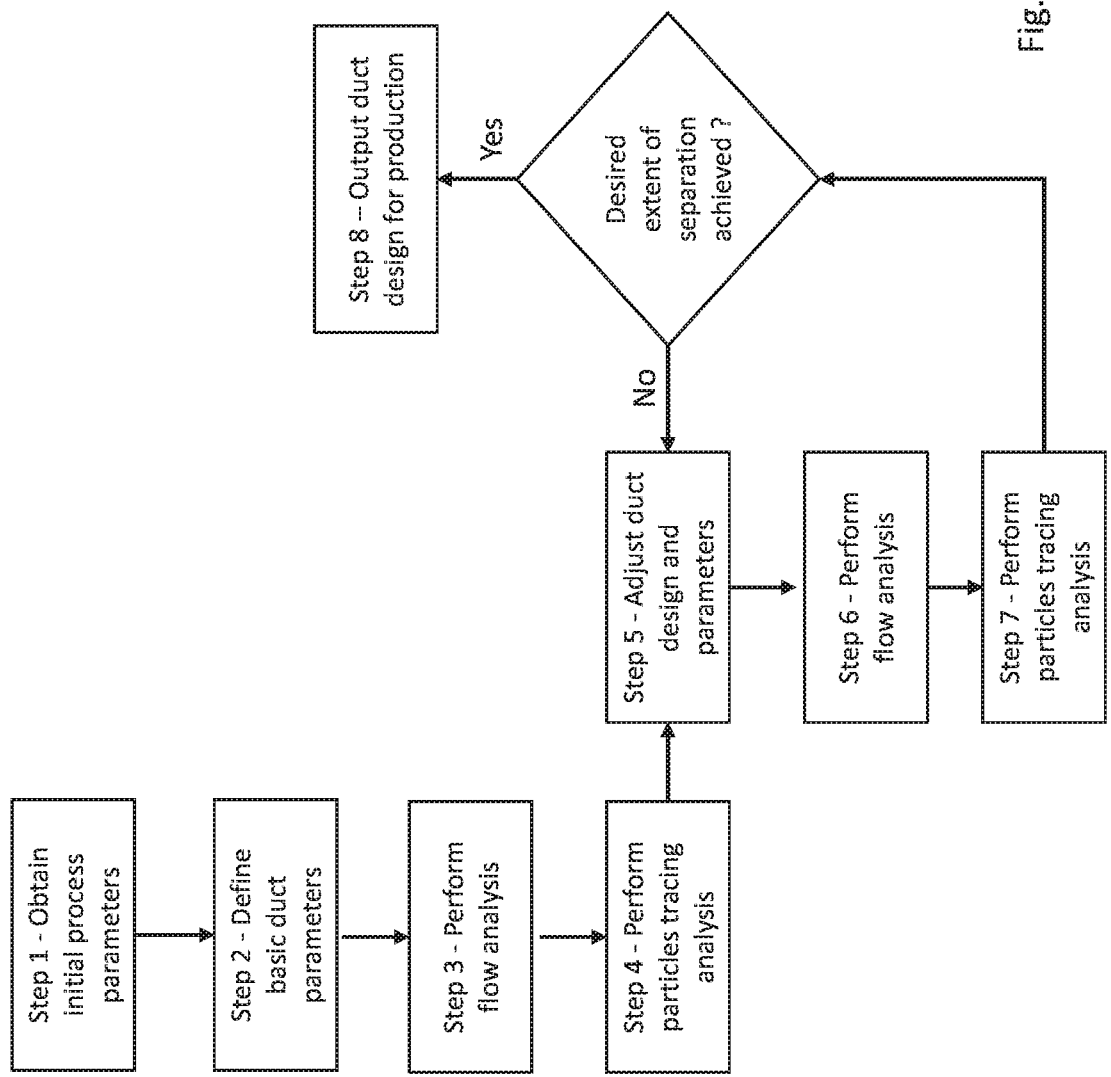
FIG. 7 is a block-diagram schematically illustrating an example of a method, by which a duct can be designed, in accordance with the presently disclosed subject matter.

A duct according to the presently described subject matter can be used with fluids that contain particles of various types and characteristics. The particles can be in the form of solid, liquid or gas particles suspended in a fluid and need to be separated at least partially by means of the trapping-bays and, optionally, partitioned portions, as described above. To decide where one or more of the trapping-bays and partitioned portions are to be disposed when designing the duct, a computer-implemented method can be used, one example of which is described below with reference to FIG. 7. To perform such method the computer should be provided with appropriate software allowing to perform flow analysis and particles tracing simulation referred to in Steps 3 and 4 below.

In Step 1, initial process parameters are input in a computer, including parameters of the fluid, particles suspended in the fluid, flow parameters and desired extent of separation between the fluid and the particles to be discharged.

The fluid parameters can include viscosity, velocity, temperature and pressure, which the fluid is expected to have when entering the duct or flowing along the duct. In addition, the initial process parameters can be include operational parameters dictated by the required environment of operation and working standards.

The initial parameters of the particles suspended within the fluid can include at least their sizes, specific weights and nature. For example: the specific weights of a particle can be higher than the specific weight of the carrying fluid, however, when it is coated by a layer of air, the effect of the air in reducing the gross specific weight of particle plus air, can be substantial.

In Step 2, basic duct parameters are selected based on the initial process conditions. The basic duct parameters relate at least to the basic geometry of the duct and can comprise dimensions of the duct, such as its length along the central line of the duct defining a fluid flow direction, duct profile curvature along the central line, planned exit ports, the duct's shape in a cross-section taken perpendicular to the central line, and its width and height in this cross-section.

In Step 3, a flow analysis is performed of the flow, which the fluid entering the duct with the initial process parameters obtained in Step 1, will have when flowing along the duct having the basic duct parameters defined in Step 2; the flow analysis can provide at least the assessment of the velocity and pressure profiles that develop along the duct and calculating the time the particles will spend within the duct.

In Step 4, a particle tracing simulation is performed with respect to the particles having the initial parameters obtained in Step 1, to study their behavior in the flow analyzed in Step 3 above. This analysis can provide information about the particles' distribution in the duct having the basic parameters defined in Step 2, percentage of separation that can be obtained in the duct, efficiency of duct profiles, and time spent along the duct. By analyzing the simulation results, one can target potential locations, in which trapping-bay and partition portions can be formed in the duct.

Figure 8:
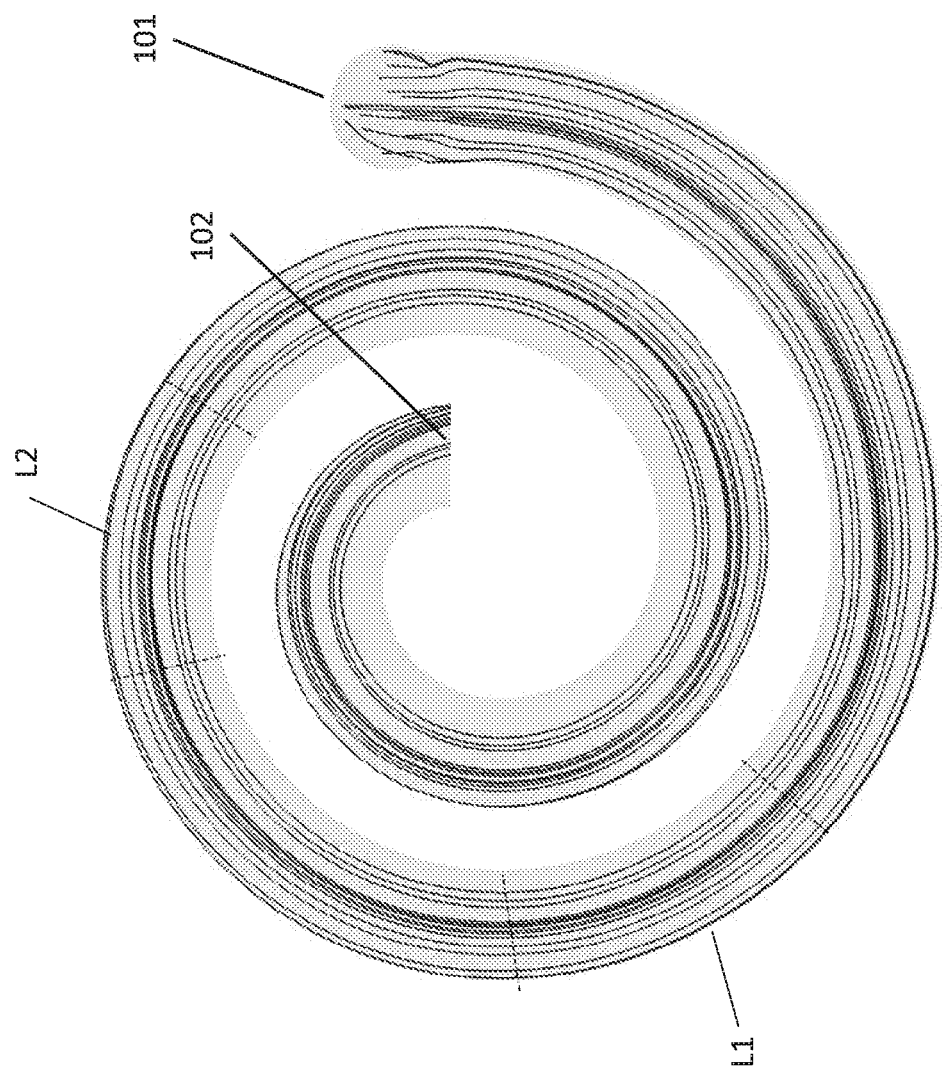
FIG. 8 is an example of particles tracing simulation which can be used in a method, according to one embodiment of the presently disclosed subject matter.

FIG. 8 schematically illustrates an example of such results obtained for a spiral shaped duct, in which the fluid was water and particles were of sand dust. In this duct, L1 and L2 are examples of candidate zone for having trapping bays on the outer wall of the duct in order to trap particles shown as accumulated along this wall. In addition, a trapping bay could be added, for example, in between L1 and L2 in order to control the flow to accelerate particles accumulation towards the outer wall.

In Step 5, the duct parameters are updated based on the particle tracing simulation. The updated parameters can include overall or local changes in the duct geometry such as incorporating trapping-bay and, optionally, partition portions and/or changing dimensions of the duct basic channel in its different cross-sections and/or the length of the duct/or its curvature of duct portions.

In Steps 6 and 7, the flow analysis and the particle tracing simulations are performed similar to those performed in Steps 4 and 5, and if the desired extent of separation is not achieved, Steps 5, 6 and 7 are performed again as many times as necessary until the extent of separation as analyzed corresponds to the desired extent of separation.

In Step 8, the geometry of the duct is output for use in manufacturing the duct accordingly by any suitable method known in the art.

The invention claimed is:

1. A duct for use in a system for separating particles suspended in a fluid, the duct comprising:
   duct portions differing in shape thereof in a cross-section of the duct, each of the duct portions extending along a part of a length of the duct, the duct portions including:
   at least one basic channel portion configured to allow the fluid to flow therein along a flow direction; and at least one trapping-bay portion disposed downstream from the at least one basic channel portion, said at least one trapping-bay portion having a main channel constituting a continuation of the at least one basic channel portion and extending along a curved central line and one or more trapping bays coextensive with the main channel along the curved central line;

wherein said at least one basic channel portion is free of trapping bays and being configured to provide a pre-determined particles distribution in the fluid flow upstream from the at least one trapping-bay portion, the at least one trapping-bay portion configured to maintain said pre-determined particles distribution while trapping at least a part of said particles in the one or more trapping bays thereof;

wherein the main channel and at least one of the one or more trapping bays are as follows in a cross-section of the at least one trapping-bay portion taken perpendicularly to said central line:

the main channel has a basic polygonal shape defined by at least four channel walls including an outer channel wall, an inner channel wall, an upper channel wall, and a lower channel wall; and the at least one of the one or more trapping bays protrudes from at least one of the inner and outer channel walls away from the curved central line and has bay walls generally parallel to the corresponding walls of the main channel, each of the bay walls being oriented in the same way as that of respective wall of the main channel, the area of the at least one of the one or more trapping bays being smaller than that of the main channel.

2. The duct of claim 1, wherein at least some of the bays walls of the trapping bay have lengths that are shorter than those of the corresponding walls of the main channel.

3. The duct of claim 1, wherein the basic polygonal shape of the main channel is rectangular and is such that a distance between the upper and lower channel walls of the main channel is essentially shorter than that between the inner and outer channel walls thereof.

4. The duct of claim 1, wherein:
each of the duct portions extends between transition locations; and
at the transition location between the at least one basic channel portion and the at least one trapping-bay portion, the at least one basic channel portion has shape and dimensions identical to those of the main channel of the at least one trapping-bay portion.

5. The duct of claim 1, wherein at least said trapping-bay portion is configured for maintaining the same extent of laminarity of fluid flowing therein as immediately upstream of said trapping-bay portion.

6. The duct of claim 1, wherein said trapping-bay portion constitutes at least a portion of a turning of a spiral or of a circle.

7. The duct of claim 1, further comprising at least one partitioned portion, which has a first channel extending along the curved central line and a second channel coextensive with the first channel along the curved central line and configured to trap at least a part of said particles, and which includes at least one partition wall extending along a length of the partitioned portion and disposed between an outer or inner channel wall of the first channel and the curved central line, and configured to enable continuation of fluid flow along the first channel while preventing movement of trapped particles back to the first channel.

8. The duct of claim 7, wherein said at least one partition wall is disposed closer to the second channel than to the curved central line, and configured to enable continuation of fluid flow along the first channel and along the second channel while preventing movement of particles trapped within the second channel back to the first channel.

9. The duct of claim 8, wherein said at least one partition wall includes at least two partition walls disposed between the curved central line and either the outer or inner channel wall of the first channel.

10. The duct of claim 8, wherein said at least one partition wall extends between upper and lower channel walls of the first channel.

11. The duct of claim 1, further comprising an inlet for receiving therein fluid and each of said main channel and the trapping bay includes a respective outlet for discharging fluid therefrom.

12. The duct of claim 1, wherein in at least one segment of the duct, in a cross-sectional plane of the segment passing through the curved central line and crossing inner and outer duct walls, at least one of the inner and outer duct walls of said segment has a profile defined by a varying distance between the at least one duct wall and the curved central line.

13. The duct of claim 12, wherein the profile of at least one of the inner and outer walls has an undulating shape.

14. The duct of claim 13, wherein said undulating shape is sinusoidal.

* * * * *